US012677679B2

(12) United States Patent
  Oh et al.

(10) Patent No.:    US 12,677,679 B2
(45) Date of Patent:         Jul. 7, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Dongjoon Oh, Suwon-si (KR); Jumyong Park, Suwon-si (KR); Solji Song, Suwon-si (KR); Hyunchul Jung, Suwon-si (KR); Sanghoo Cho, Suwon-si (KR); Hyunsu Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 489 days.

(21) Appl. No.: 18/141,519

(22) Filed: May 1, 2023

(65) Prior Publication Data

US 2024/0145366 A1    May 2, 2024

(30) Foreign Application Priority Data

Oct. 28, 2022    (KR) ........................ 10-2022-0141062

(51) Int. Cl.
  *H01L 23/498*        (2006.01)
  *H01L 25/065*        (2023.01)
        (Continued)

(52) U.S. Cl.
  CPC ......... *H10W 70/635* (2026.01); *H10P 50/267* (2026.01); *H10P 50/667* (2026.01); (Continued)

(58) Field of Classification Search
  CPC ......... H01L 23/49827; H01L 21/32134; H01L 21/32136; H01L 21/76898; H10W 70/635;
        (Continued)

(56)            References Cited

U.S. PATENT DOCUMENTS 10,163,864 B1    12/2018  England
10,276,619 B2     4/2019  Kao et al.
          (Continued)

FOREIGN PATENT DOCUMENTS

KR      1020220075030 A      6/2022
KR      1020220081036 A      6/2022
KR      1020220102547 A      7/2022

*Primary Examiner* — Dale E Page
*Assistant Examiner* — Wilner Jean Baptiste
(74) *Attorney, Agent, or Firm* — Muir Patent Law, PLLC

(57)              ABSTRACT

A method of manufacturing a semiconductor package including forming a first semiconductor chip including a first substrate having a first and second surfaces and forming a second semiconductor chip including a second substrate having third and fourth surfaces. Arranging the second semiconductor chip on the first semiconductor chip such that bonding pads that are exposed from the front surface of the second semiconductor chip are bonded to conductive pads that are exposed from the rear surface of the first semiconductor chip. Forming a first through via having a first diameter and that penetrates the first substrate. Forming an insulating layer that exposes a first end of the first through via on the second surface of the first substrate, etching the first end of the first through via to a first depth, and applying a conductive material to the first end to form the conductive pad having a second diameter.

20 Claims, 22 Drawing Sheets

10

(51) Int. Cl.

| | |
|---|---|
| *H10P 50/26* | (2026.01) |
| *H10P 50/66* | (2026.01) |
| *H10W 20/00* | (2026.01) |
| *H10W 70/63* | (2026.01) |
| *H10W 90/00* | (2026.01) |
| *H10W 72/00* | (2026.01) |
| *H10W 72/90* | (2026.01) |
| *H10W 74/00* | (2026.01) |
| *H10W 80/00* | (2026.01) |
| *H10W 90/20* | (2026.01) |

(52) U.S. Cl.
CPC ... *H10W 20/023* (2026.01); *H10W 72/01338* (2026.01); *H10W 90/00* (2026.01); *H10W 72/01333* (2026.01); *H10W 72/926* (2026.01); *H10W 72/944* (2026.01); *H10W 74/00* (2026.01); *H10W 80/312* (2026.01); *H10W 80/721* (2026.01); *H10W 80/743* (2026.01); *H10W 90/297* (2026.01); *H10W 90/731* (2026.01); *H10W 90/732* (2026.01); *H10W 90/791* (2026.01); *H10W 90/792* (2026.01)

(58) Field of Classification Search
CPC ... H10W 20/023; H10P 50/267; H10P 50/667
See application file for complete search history.

(56) References Cited

U.S. PATENT DOCUMENTS

| | | | | |
|---|---|---|---|---|
| 11,011,494 | B2 | 5/2021 | Gao et al. | |
| 11,049,834 | B2 | 6/2021 | Wang et al. | |
| 11,133,290 | B2* | 9/2021 | Zeng | H01L 24/19 |
| 11,264,345 | B2 | 3/2022 | Enquist | |
| 2015/0348877 | A1* | 12/2015 | Huang | H01L 23/3185 |
| | | | | 257/734 |
| 2019/0371763 | A1* | 12/2019 | Agarwal | H10W 90/00 |
| 2019/0385935 | A1 | 12/2019 | Gao et al. | |
| 2021/0257333 | A1 | 8/2021 | Yan | |
| 2022/0208683 | A1* | 6/2022 | Ohba | H01L 21/6835 |

* cited by examiner

Figure 12A:
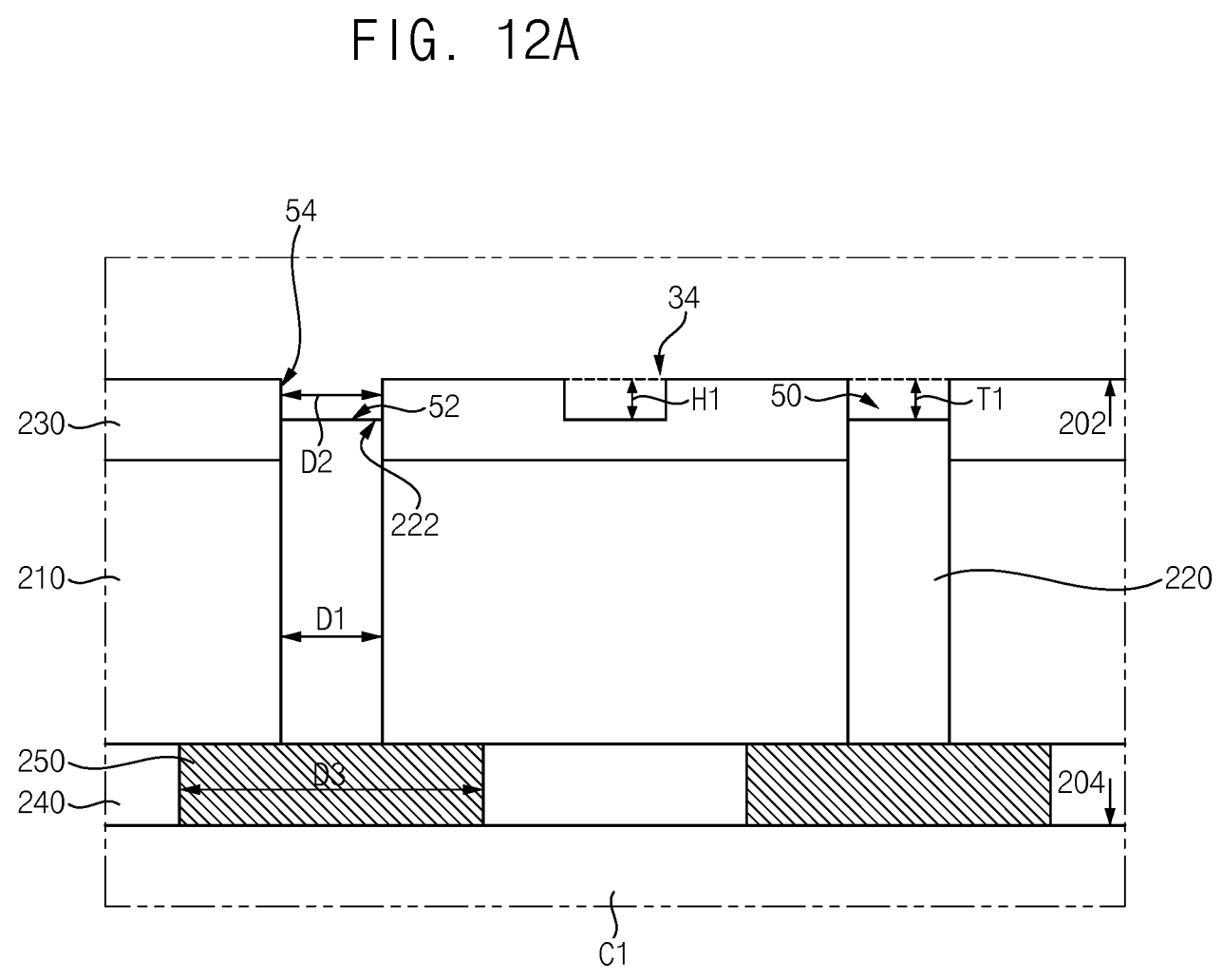

Figure 12B:
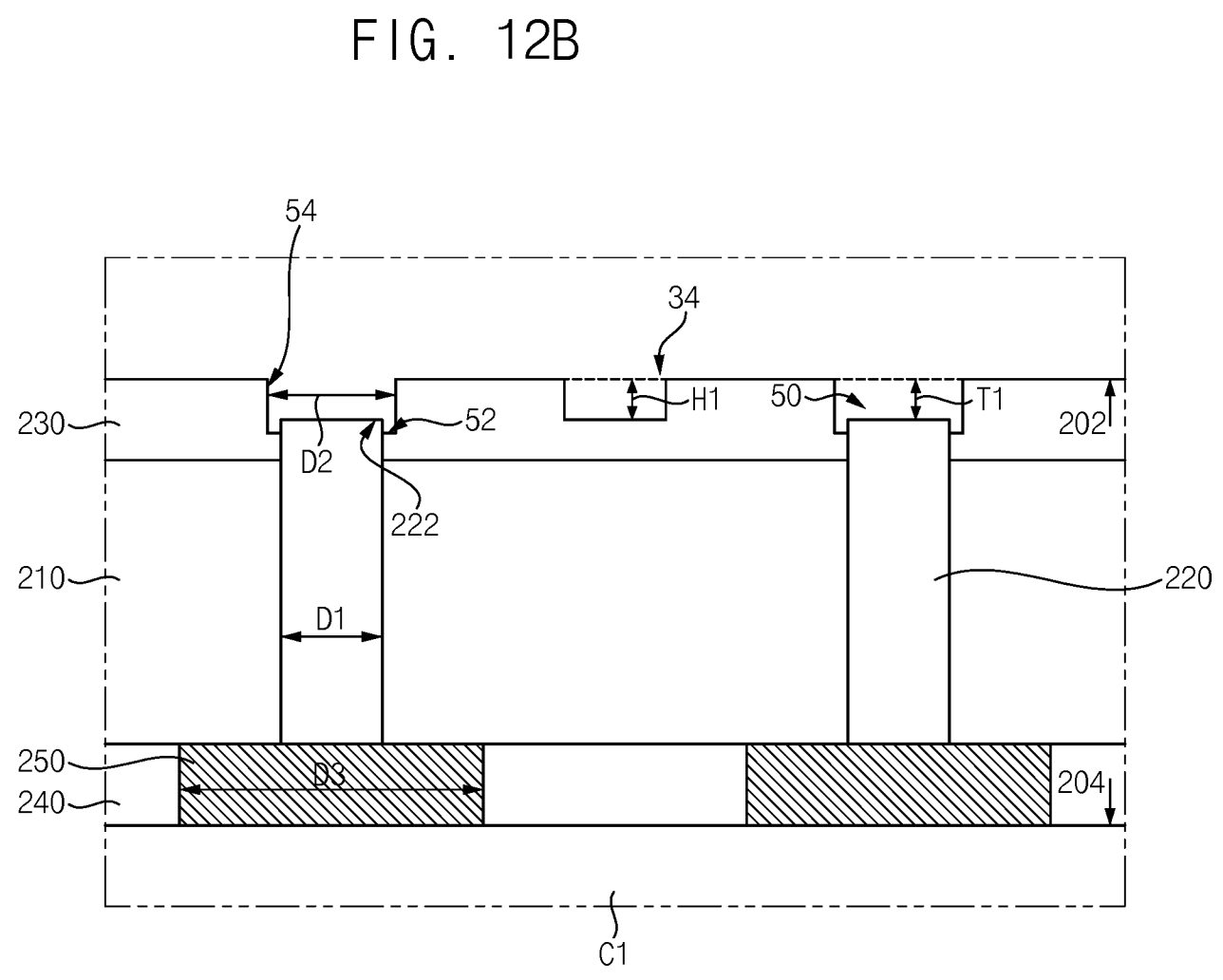

Figure 12C:
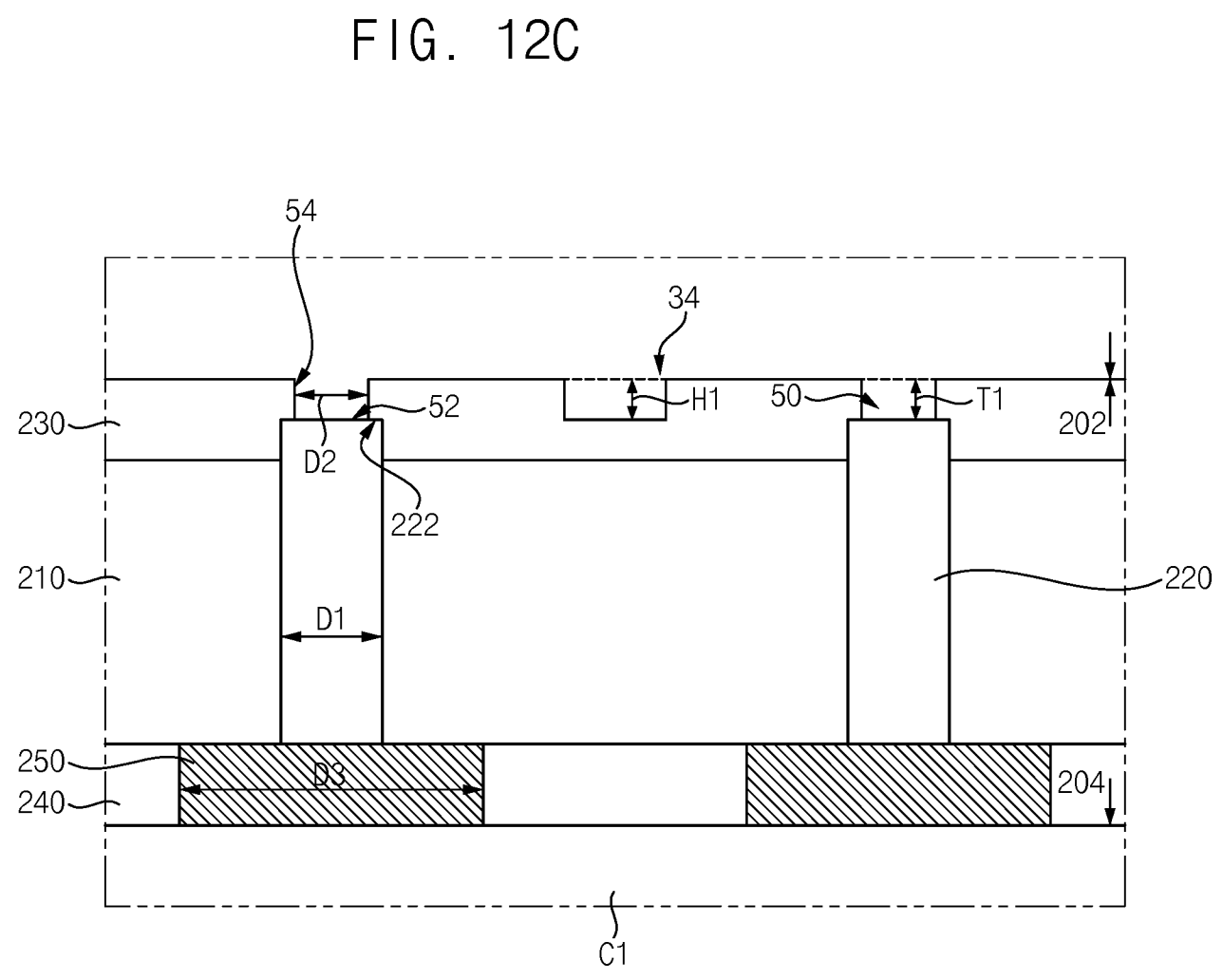

SEMICONDUCTOR PACKAGE AND METHOD OF MANUFACTURING THE SEMICONDUCTOR PACKAGE

PRIORITY STATEMENT

This application claims priority under 35 U. S.C. § 119 to Korean Patent Application No. 10-2022-0141062, filed on Oct. 28, 2022 in the Korean Intellectual Property Office (KIPO), the content of which is herein incorporated by reference in their entirety.

BACKGROUND

1. Field

Example embodiments relate to a semiconductor package and a method of manufacturing the semiconductor package. More particularly, example embodiments relate to a semiconductor package including a plurality of stacked different semiconductor chips and a method of manufacturing the same.

2. Description of the Related Art

In a bonding process of stacking a plurality of semiconductor chips, a hybrid bonding process may be used to directly bond bonding pads of the respective plurality of semiconductor chips to each other. In the hybrid bonding process, an insulating layer having bonding pads therein may increase thermal resistance of the semiconductor chip, a dishing phenomenon may occur in the bonding pads during a polishing process (CMP) process. When through vias (TSV) are directly bonded to each other by removing the bonding pads, an expansion of through vias may be reduced by thermal budget that is generated in the process, and the reduced expansion may result in a decrease in adhesion. In addition, economic loss may occur to manufacture the bonding pad.

SUMMARY

Example embodiments provide a semiconductor package including a configuration of a conductive pad that reduces thermal resistance and solves a contact problem caused by reduced expansion of through vias.

Example embodiments provide a method of manufacturing the semiconductor package.

According to example embodiments, in a method of manufacturing a semiconductor package, a first semiconductor chip including a first substrate is formed. The first substrate has first and second surfaces opposite to each other. A second semiconductor chip including a second substrate is formed. The second substrate has third and fourth surfaces opposite to each other. The second semiconductor chip is arranged on the first semiconductor chip such that a front surface of the second semiconductor chip faces a rear surface of the first semiconductor chip. Bonding pads that are exposed from the front surface of the second semiconductor chip are bonded to conductive pads that are exposed from the rear surface of the first semiconductor chip. In forming the first semiconductor chip, a first through via that penetrates the first substrate from an activation layer formed on the first surface of the first substrate is formed. The first through via has a first diameter. An insulating layer that exposes a first end of the first through via on the second surface of the first substrate is formed. The first end of the first through via is etched to be exposed from an outer surface of the insulating layer to a first depth. A conductive material is applied on the first end of the first through via to form the conductive pad that has a second diameter.

According to example embodiments, a semiconductor package includes a first semiconductor chip having a first front surface and a first rear surface opposite to each other, and a second semiconductor chip having a second front surface that is bonded to the first rear surface of the first semiconductor chip, the second semiconductor chip having bonding pads that are exposed from the second front surface. The first semiconductor chip includes a first substrate having a first surface, and a second surface opposite to the first surface, a circuit layer provided on the first surface of the first substrate, a through via extending to penetrate through the first substrate, the through via having a first diameter, an insulating layer covering the through via on the second surface of the first substrate, the insulating layer having an opening that has a first depth from an outer surface of the insulating layer, the opening having a bottom surface that exposes a first end of the through via, and a conductive pad provided on the exposed first end of the through via in the opening of the insulating layer, the conductive pad bonded to the bonding pad of the second semiconductor chip.

According to example embodiments, in a method of manufacturing a semiconductor package, a first semiconductor chip including a first substrate is formed. The first substrate has first and second surfaces opposed to each other. A second semiconductor chip including a second substrate is formed. The second substrate has third and fourth surfaces opposite to each other. The second semiconductor chip is arranged on the first semiconductor chip such that a front surface of the second semiconductor chip faces a rear surface of the first semiconductor chip. Bonding pads that are exposed from the front surface of the second semiconductor chip are bonded to conductive pads that are exposed from the rear surface of the first semiconductor chip. In forming the first semiconductor chip, a first through via that penetrates the first substrate from an activation layer formed on the first surface of the first substrate is formed. The first through via has a first diameter. An insulating layer that exposes a first end of the first through via on the second surface of the first substrate is formed. The first end of the first through via is etched to be exposed from an outer surface of the insulating layer to a first depth. A conductive material is applied on the first end of the first through via to form the conductive pad that has a second diameter.

According to example embodiments, in the forming the second semiconductor chip, a second through via that penetrates the second substrate from the bonding pads formed on the third surface of the second substrate may be formed. The second through via may have a third diameter. A second insulating layer that exposes a first end of the second through via on the fourth surface of the second substrate may be formed. The first end of the second through via may be etched to be exposed from an outer surface of the second insulating layer to a second depth. A plurality of second cavities may be formed on the outer surface of the second insulating layer. The conductive material may be applied on the first end of the second through via to form the conductive pad that has a second diameter equal to the first diameter and on the second cavities to form a plurality of second dummy pads.

Thus, the first through via of the first semiconductor chip may be bonded to the bonding pad of the second semiconductor chip through the conductive pad. After the first through via penetrating the first substrate is formed, the conductive pad may be formed on the first end of the first through via. In a process of forming the first through via, an expansion of the first through via caused by a thermal budget may cause an adhesion problem with the bonding pad of the second semiconductor chip. The conductive pad formed on the first end of the first through via may solve the adhesion problem.

Also, since a first diameter of the first through via and a second diameter of the conductive pad are the same, a dishing phenomenon that occurs in the conductive pad may be solved. Since the first through via is etched to form the conductive pad, a thickness of the insulating layer may decrease, and thermal resistance in the first semiconductor chip may decrease. Since the conductive pad is formed simultaneously with the dummy pad, a manufacturing process may be simplified and a manufacturing cost may be reduced.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

FIG. 1 is a cross-sectional view illustrating a semiconductor package in accordance with example embodiments.

FIGS. 2A, 2B, and 2C are enlarged cross-sectional views illustrating portion 'A' in FIG. 1.

FIGS. 3 to 11, 12A, 12B, 12C, and 13 to 18 are cross-sectional views illustrating a method of manufacturing a semiconductor package in accordance with example embodiments.

DETAILED DESCRIPTION OF EXAMPLE EMBODIMENTS

Figure 3:
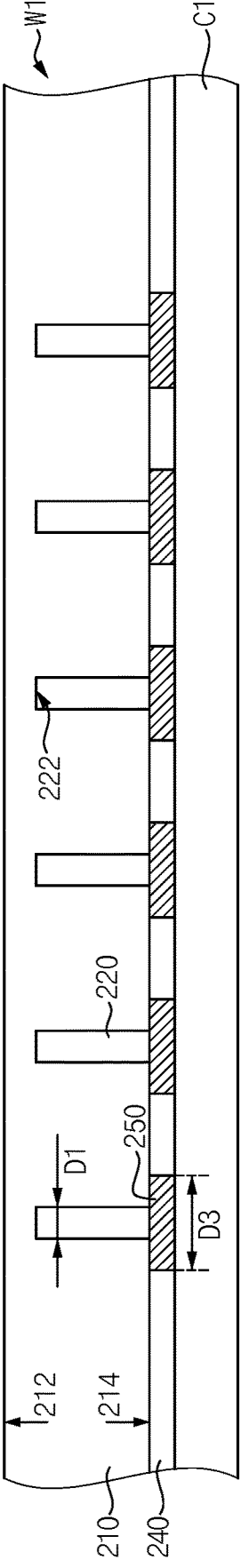

Hereinafter, example embodiments will be explained in detail with reference to the accompanying drawings.

Figure 1:
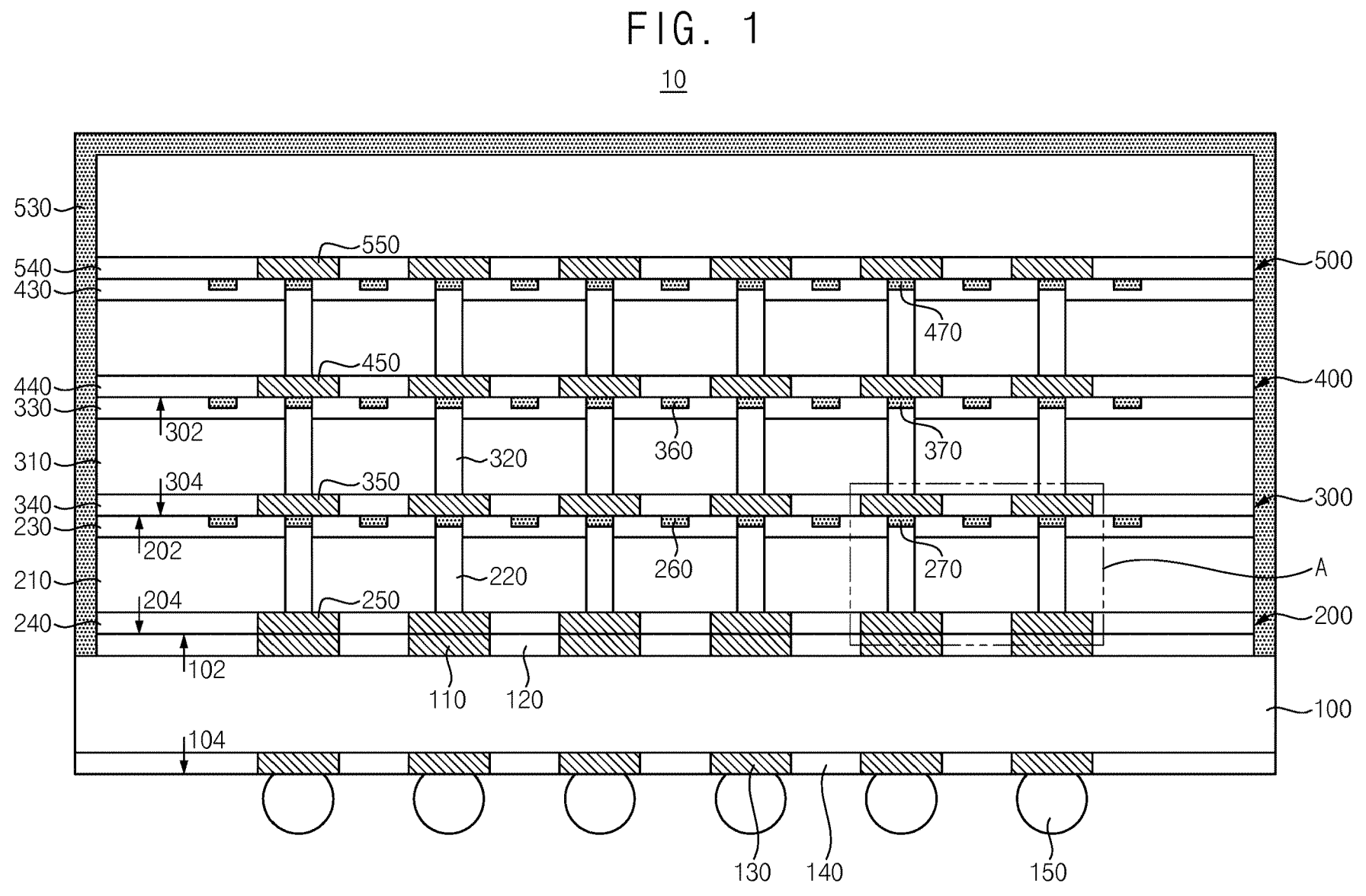
Figure 2A:
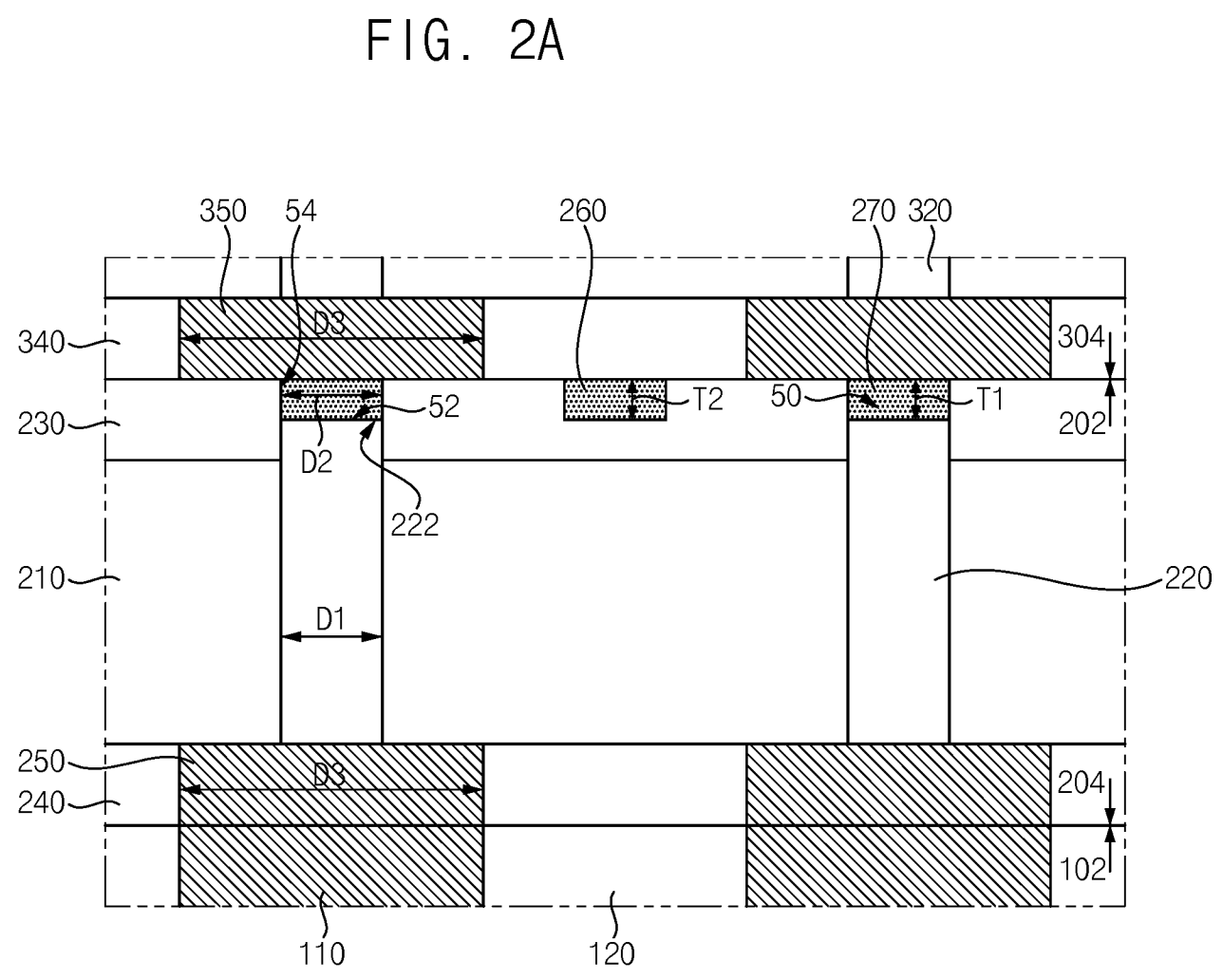
Figure 2B:
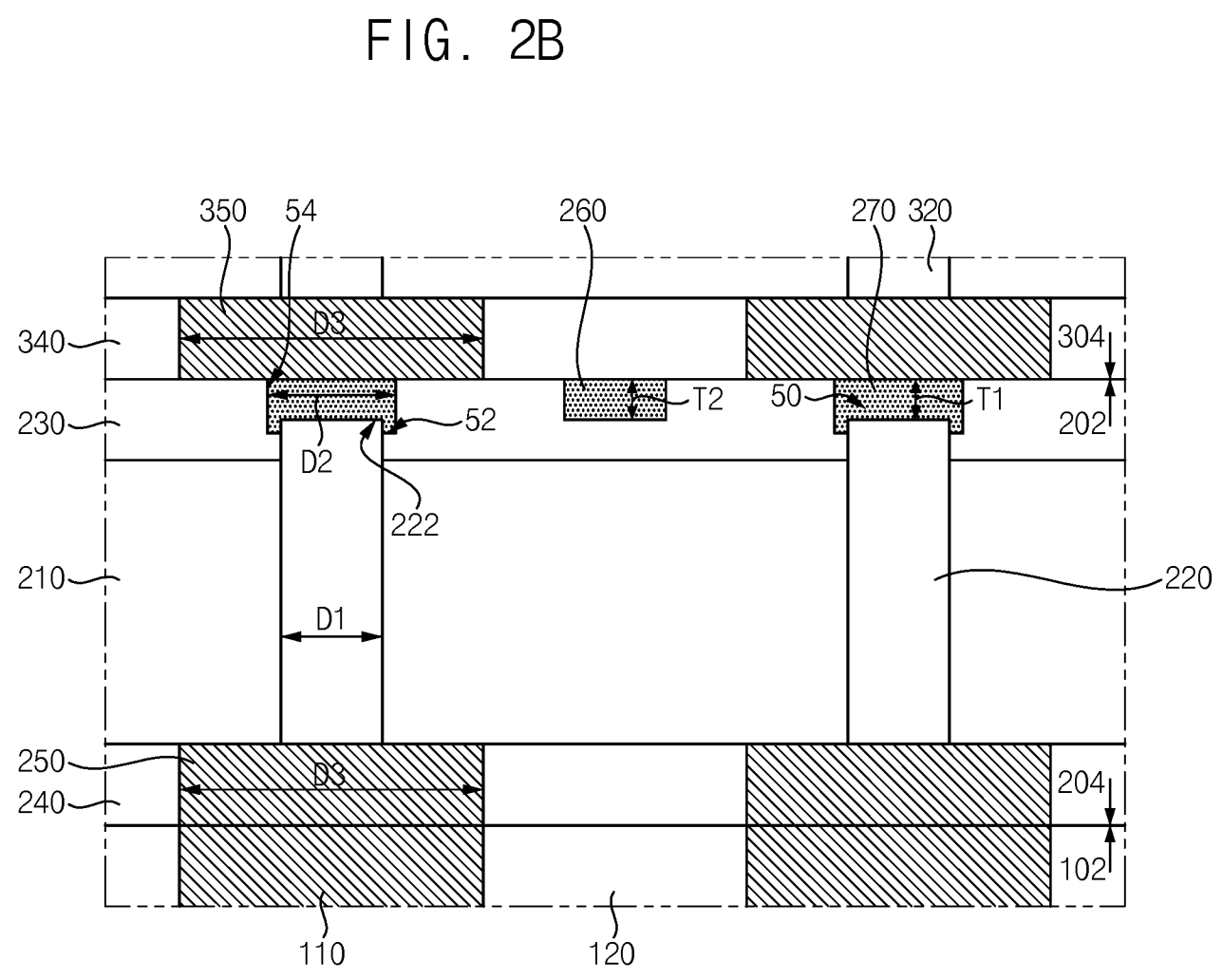
Figure 2C:
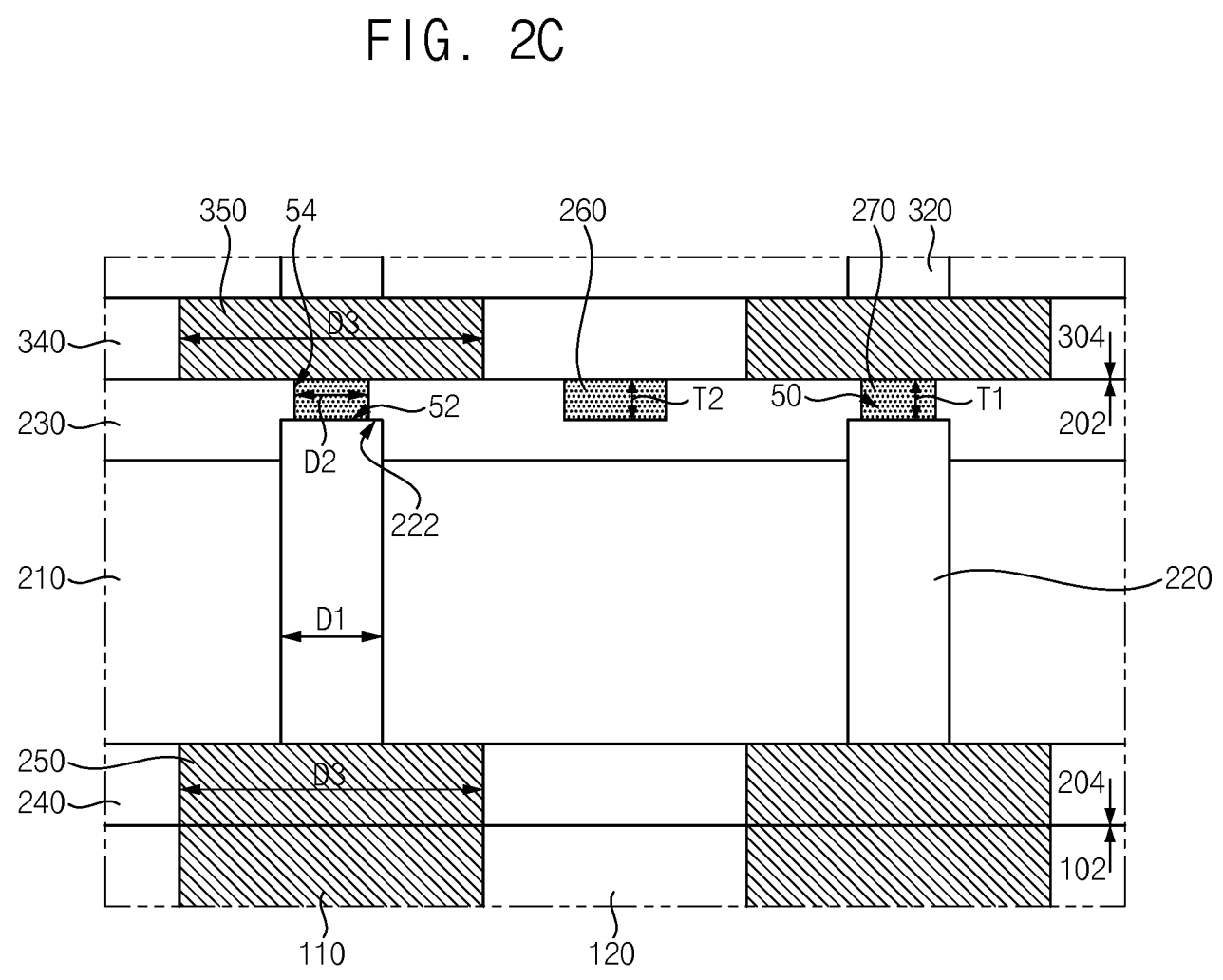

FIG. 1 is a cross-sectional view illustrating a semiconductor package in accordance with example embodiments. FIGS. 2A, 2B, and 2C are enlarged cross-sectional views illustrating portion 'A' in FIG. 1.

Referring to FIGS. 1, 2A, 2B, and 2C, a semiconductor package 10 may include a buffer die 100, and a plurality of semiconductor chips stacked on the buffer die 100. The semiconductor package 10 may include first to fourth semiconductor chips 200, 300, 400, and 500 stacked on the buffer die 100, sequentially.

A plurality of the semiconductor chips 200, 300, 400, and 500 may be vertically stacked on the buffer die 100. In example embodiments, the buffer die 100 and the first to fourth semiconductor chips 200, 300, 400, and 500 may be substantially the same as or similar to each other. Thus, same or similar components are denoted by the same or similar reference numerals, and repeated descriptions of the same components will be omitted. The buffer die 100 and the first to fourth semiconductor chips 200, 300, 400, and 500 may extend in a first direction and a second direction perpendicular to the first direction. The semiconductor chips 200, 300, 400, and 500 may be vertically stacked (i.e., in a third direction perpendicular to the first direction and the second direction) on the buffer die 100.

The buffer die 100 may be referred to as a chip that has an upper surface 102 and a lower surface 104 facing each other. The buffer die 100 may include a first substrate pad 110, a second substrate pad 130, a first substrate insulating layer that 120 exposes (i.e., does not cover a top surface) the first substrate pad 110, and a second substrate insulating layer 140 that exposes (i.e., does not cover a top surface) the second substrate pad 130. The first substrate pad 110 may be provided on the upper surface 102 of the buffer die 100, and the second substrate pad 130 may be provided on the lower surface 104. An external connection member 150 may be provided on the second substrate pad 130 to electrically connect the buffer die 100 to other semiconductor devices. For example, the first substrate pad 110 and the second substrate pad 130 may be respectively embedded in the first substrate insulating layer 120 and the second substrate insulating layer that 140 such that the respective side surfaces of the first substrate pad 110 and the second substrate pad 130 are covered, but the respective top surfaces of the first substrate pad 110 and the second substrate pad 130 are not covered.

In this embodiment, the semiconductor package as a multi-chip package is illustrated as including the buffer die 100 and the four stacked semiconductor chips 200, 300, 400, and 500. However, it is not limited thereto, and for example, the semiconductor package may include 8, 12, or 16 stacked semiconductor chips.

Each of the first to fourth semiconductor chips 200, 300, 400, and 500 may include an integrated circuit chip that is completed by performing semiconductor manufacturing processes. Each of the semiconductor chips may include, for example, a memory chip or a logic chip. The semiconductor package 10 may include a memory device. The memory device may include a high bandwidth memory (HBM) device.

Hereinafter, first, the first semiconductor chip 200 will be described.

The first semiconductor chip 200 may be arranged on the buffer die 100. The first semiconductor chip 200 may include a first rear surface 202 and a first front surface 204 opposite to each other. The first semiconductor chip 200 may be disposed on the buffer die 100, and the first front surface 204 of the first semiconductor chip 200 may face the buffer die 100. The second semiconductor chip 300 may be arranged on the first rear surface 202 of the first semiconductor chip 200. For example, the first front surface 204 of the first semiconductor chip 200 may contact the buffer die 100 and the first rear surface 202 of the first semiconductor chip 200 may contact the second semiconductor chip 300. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" or "contact" another element, there are no intervening elements present at the point of contact.

The first front surface 204 of the first semiconductor chip 200 may face the upper surface 102 of the buffer die 100. A first lower insulating layer 240 of the first semiconductor chip 200 and the buffer die 100 may be directly bonded to each other. Thus, a first bonding pad 250 and the first substrate pad 110 may be bonded to each other by copper-copper hybrid bonding between the buffer die 100 and the first semiconductor chip 200. For example, pad to pad direct bonding of the first bonding pad 250 and the first substrate pad 110 may be formed.

In example embodiments, the first semiconductor chip 200 may include a first substrate 210, a first upper insulating layer 230 provided on an upper surface of the first substrate 210, the first lower insulating layer 240 covering a first circuit layer provided on a lower surface of the first substrate 210, a first conductive pad 270 provided in the first upper insulating layer 230, the first bonding pad 250 provided in the first lower insulating layer 240, and a first through via 220 electrically connected to the first circuit layer and extending between the first bonding pad 250 and the first conductive pad 270. In addition, the first semiconductor chip 200 may further include a plurality of first dummy pads 260 provided in the first upper insulating layer 230.

In example embodiments, the first substrate 210 may have an active surface and an inactive surface opposite to each other. An activation layer may be provided on the active surface of the first substrate 210. Circuit patterns may be provided on the activation layer of the first substrate 210. For example, the first substrate 210 may include a semiconductor material such as silicon, germanium, or silicon-germanium. The first substrate 210 may include III-V compound semiconductors such as gallium phosphide (GaP), gallium arsenide (GaAs), or gallium antimonide (GaSb).

The circuit patterns may include transistors, diodes, and the like. The circuit patterns may constitute circuit elements. Accordingly, the first semiconductor chip 200 may include a plurality of the circuit elements therein. The circuit patterns may be formed by a wafer process called a front-end-of-line (FEOL) process.

A wiring layer may be provided on one surface of the first substrate 210. The wiring layer may be formed on the one surface of the first substrate 210 by a wiring process called a back-end-of-line process. The wiring layer may include redistribution wires therein. For example, the redistribution wires may include aluminum (Al), copper (Cu), tin (Sn), nickel (Ni), gold (Au), platinum (Pt), or an alloy thereof.

In example embodiments, the first through via 220 may be electrically connected to the first circuit layer. The first through via 220 may extend to penetrate through the first substrate 210.

A first end 222 of the first through via 220 may be electrically connected to the first conductive pad 270. A second end of the first through via 220 may vertically (i.e., in the third direction) penetrate the first substrate 210, and may be electrically connected to the first bonding pad 250. Accordingly, the first bonding pad 250 and the first conductive pad 270 may be electrically connected through the first through via 220.

The first through via 220 may have a first diameter D1. For example, the first diameter D1 may be within a range of 2 μm to 6 μm.

The first through via 220, the first bonding pad 250 and the first conductive pad 270 may include the same metal. For example, the metal may include copper (Cu). However, it is not limited thereto, and the metal may include a material (e.g., gold (Au)) that is combined by interdiffusion of metals by a high-temperature annealing process. Alternatively, the first through via 220 includes a first metal material, and the first conductive pad 270 may include a second metal material that is different from the first metal material.

In example embodiments, the first upper insulating layer 230 may be provided on the upper surface of the first substrate 210. The first upper insulating layer 230 may cover at least a portion of an outer surface of the first through via 220. The first upper insulating layer 230 may be provided on the first rear surface 202 of the first semiconductor chip 200. The first upper insulating layer 230 may be provided on an entire surface of the first substrate 210 as an interlayer insulating layer.

The first upper insulating layer 230 may have a first opening 50 having a bottom surface 52 that exposes the first end 222 of the first through via 220. The first upper insulating layer 230 may expose the first conductive pad 270, provided on the first end 222 of the first through via 220, to the first rear surface 202 of the first semiconductor chip 200 through the first opening 50.

As illustrated in FIG. 2A, the bottom surface 52 of the first opening 50 may be provided on a same plane (i.e., coplanar) with an upper surface of the first through via 220. A diameter D2 of the first opening 50 may be the same as the first diameter D1 of the first through via 220. A sidewall 54 of the first opening 50 may be provided to be spaced apart from the outer surface of the first through via 220. The first upper insulating layer 230 may cover the first through vias 220 on the first rear surface 202 of the first semiconductor wafer semiconductor chip 200. Accordingly, in the third direction, a bottom surface of the first conductive pad 270 may be provided on the same plane with an upper surface (e.g., the first end 222) of the first through via 220. Further, a diameter of the first conductive pad 270 may be the same as the first diameter D1 of the first through via 220. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes As illustrated in FIG. 2B, the upper surface of the first through via 220 may be higher than the bottom surface 52 of the first opening 50. The bottom surface 52 of the first opening 50 may be lower than the upper surface of the first through via 220. The diameter D2 of the first opening 50 may be greater than the first diameter D1 of the first through via 220. Accordingly, in the third direction, the bottom surface of the first conductive pad 270 may be lower than the upper surface (e.g., the first end 222) of the first through via 220. Further, the diameter of the first conductive pad 270 may be greater than the first diameter D1 of the first through via 220.

As illustrated in FIG. 2C, the upper surface of the first through via 220 and the bottom surface 52 of the first opening 50 may be provided on the same plane. The diameter D2 of the first opening 50 may be smaller than the first diameter D1 of the first through via 220. Accordingly, in the third direction, a bottom surface of the first conductive pad 270 may be provided on the same plane with an upper surface (e.g., the first end 222) of the first through via 220. Further, a diameter of the first conductive pad 270 may be less than the first diameter D1 of the first through via 220.

The first upper insulating layer 230 may have a plurality of cavities that include first dummy pads 260, respectively. The cavity may be opened from the first upper insulating layer 230 to the first rear surface 202 of the first semiconductor chip 200. The first upper insulating layer 230 may include a polymer or a dielectric layer. The first upper insulating layer may be formed by a vapor deposition process, a spin coating process, or the like.

In example embodiments, the first lower insulating layer 240 may be provided on the first front surface 204 of the first semiconductor chip 200. The first lower insulating layer 240 may be formed on a rear surface opposite to the front surface of the first substrate 210. The first bonding pad 250 may be embedded in the first lower insulating layer 240. For example, the first lower insulating layer 240 may contact side surfaces of the first bonding pad 250 and top surface of the first lower insulating layer 240 may be substantially coplanar with a top surface of the first bonding pad. The first bonding pad 250 may contact the second end of the first through via 220. The first lower insulating layer 240 may include silicon oxide, carbon-doped silicon oxide, silicon carbonitride (SiCN), or the like.

In example embodiments, the first conductive pad 270 may be provided on the first end 222 of the first through via 220. The first conductive pad 270 may be provided to be exposed to the first rear surface 202 of the first semiconductor chip 200 on the first through via 220. The first conductive pad 270 may be provided in the first opening of the first upper insulating layer 230. The first conductive pad 270 may compensate for a decrease in expansion of the first through via 220 that is caused by a temperature change.

The first conductive pad 270 may be exposed through the first rear surface 202 of the first semiconductor chip 200, and may be bonded to a second bonding pad 350 of the second semiconductor chip 300. The first conductive pad 270 may electrically connect the first and second semiconductor chips 200 and 300 to each other.

The first conductive pad 270 may have a second diameter D2. The second diameter D2 of the first conductive pad 270 may be the same as the first diameter D1 of the first through via 220. The first conductive pad 270 may have a first thickness T1. For example, the second diameter D2 may be within a range of 2 μm to 6 μm. The first thickness T1 may be within a range of 0.5 μm to 1.5 μm.

The second metal material of the first conductive pad 270 may be the same as the first metal material of the first through via 220. Alternatively, the second metal material of the first conductive pad 270 may be different from the first metal material of the first through via 220. In this case, the second metal material may have a higher coefficient of thermal expansion than the first metal material. The first conductive pad 270 may expand within the first opening of the first upper insulating layer 230 through the second metal material to fill the first opening.

For example, the second metal material of the first conductive pad 270 may include nickel (Ni), antimony (Sb), bismuth (Bi), zinc (Zn), indium (In), palladium (Pd), platinum. (Pt), aluminum (Al), copper (Cu), molybdenum (Mo), titanium (Ti), gold (Au), silver (Ag), chromium (Cr), and tin (Sn).

In example embodiments, a plurality of the first dummy pads 260 may be provided in the cavities of the first upper insulating layer 230, respectively. The first dummy pad 260 may be provided to be exposed to the first rear surface 202 of the first semiconductor chip 200 within the first upper insulating layer 230. The first dummy pads 260 may absorb heat inside the first semiconductor chip 200, and may discharge the heat to outside.

The first dummy pad 260 may be exposed through the first rear surface 202 of the first semiconductor chip 200, and may be bonded to a second lower insulating layer 340 of the second semiconductor chip 300. Alternatively, the first dummy pad 260 may be bonded to another dummy pad that is exposed through the second front surface 304 of the second semiconductor chip 300. The first dummy pad 260 may be electrically insulated from the first and second semiconductor chips 200 and 300. The first dummy pad 260 may reduce thermal resistance in the semiconductor package 10 between the first and second semiconductor chips 200 and 300.

The first dummy pad 260 may have a second thickness T2. The second thickness T2 of the first dummy pad 260 may be the same as the first thickness T1 of the first conductive pad 270. The first dummy pad 260 may include the second metal material as the first conductive pad 270. For example, the second thickness T2 may be within a range of 0.5 μm to 1.5 μm.

In example embodiments, the first bonding pad 250 may be provided on the second end that is opposite to the first end 222 of the first through via 220. The first bonding pad 250 may be provided on the first through via 220 to be exposed to the first front surface 204 of the first semiconductor chip 200. The first bonding pad 250 may be provided in the first lower insulating layer 240.

The first bonding pad 250 may be exposed through the first front surface 204 of the first semiconductor chip 200, and may be bonded to the first substrate pad 110 of the buffer die 100. The first bonding pad 250 may electrically connect the first semiconductor chip 200 and the buffer die 100 to each other.

The first bonding pad 250 may have a third diameter D3. The third diameter D3 of the first bonding pad 250 may be greater than the first diameter D1 of the first through via 220. The third diameter D3 of the first bonding pad 250 may be greater than the second diameter D2 of the first conductive pad 270. For example, the third diameter D3 may be within a range of 6 μm to 10 μm.

In example embodiments, the second semiconductor chip 300 may be arranged on the first semiconductor chip 200. The second semiconductor chip 300 may be arranged on the first rear surface 202 of the first semiconductor chip 200. The second semiconductor chip 300 may have a second rear surface 302 and a second front surface 304 opposite to each other. The second front surface 304 of the second semiconductor chip 300 may be bonded to the first rear surface 202 of the first semiconductor chip 200.

The second lower insulating layer 340 of the second semiconductor chip 300 and the first upper insulating layer 230 of the first semiconductor chip 200 may be directly bonded to each other. The second bonding pad 350 of the second semiconductor chip 300 may be bonded to the first conductive pad 270 of the first semiconductor chip 200. Thus, the first conductive pad 270 and the second bonding pad 350 may be bonded to each other by copper-copper hybrid bonding between the first semiconductor chip 200 and the second semiconductor chip 300. For example, pad to pad direct bonding of the first conductive pad 270 and the second bonding pad 350 may be formed.

In example embodiments, the second semiconductor chip 300 may include a second substrate 310, a second upper insulating layer 330 provided on an upper surface of the second substrate 310, the second lower insulating layer 340 covering a second circuit layer provided on a lower surface of the second substrate 310, a second conductive pad 370 provided in the second upper insulating layer 330, the second bonding pad 350 provided in the second lower insulating layer 340, and a second through via 320 electrically connected to the second circuit layer and extending between the second bonding pad 350 and the second conductive pad 370. In addition, the second semiconductor chip 300 may further include a plurality of second dummy pads 360 provided in the second upper insulating layer 330. For example, the second bonding pad 350 may have the same third diameter D3 as the first bonding pad 250.

In example embodiments, the third semiconductor chip 400 may be arranged on the second semiconductor chip 300. A third lower insulating layer 440 of the third semiconductor chip 400 and the second upper insulating layer 330 of the second semiconductor chip 300 may be directly bonded to each other. A third bonding pad 450 of the third semiconductor chip 400 may be bonded to the second conductive pad 370 of the second semiconductor chip 300. Thus, the second conductive pad 370 and the third bonding pad 450 may be bonded to each other by copper-copper hybrid bonding between the second semiconductor chip 300 and the third semiconductor chip 400. For example, pad to pad direct bonding of the second conductive pad 370 and the third bonding pad 450 may be formed.

In example embodiments, the fourth semiconductor chip 500 may be arranged on the third semiconductor chip 400. A fourth lower insulating layer 540 of the fourth semiconductor chip 500 and a third upper insulating layer 430 of the third semiconductor chip 400 may be directly bonded to each other. A fourth bonding pad 550 of the fourth semiconductor chip 500 may be bonded to a third conductive pad 470 of the third semiconductor chip 400. Thus, the third conductive pad 470 and the fourth bonding pad 550 may be bonded to each other by Cu—Cu Hybrid Bonding between the third semiconductor chip 400 and the fourth semiconductor chip 500. For example, pad to pad direct bonding of the third conductive pad 470 and the fourth bonding pad 550 may be formed.

In example embodiments, a molding member 530 may be provided on an upper surface of the fourth semiconductor chip 500. The molding member 530 may include an underfill resin such as an epoxy resin. The molding member 530 may include a silica filler or flux. The molding member 530 may include a polymer such as resin. For example, the molding member 530 may include EMC (Epoxy Molding Compound). The molding member 530 may include a different material or the same material as an underfill material layer.

Hereinafter, a method of manufacturing the semiconductor package in FIG. 1 will be described.

FIGS. 3 to 18 are cross-sectional views illustrating a method of manufacturing a semiconductor package in accordance with example embodiments. FIGS. 12A to 12C are enlarged cross-sectional views illustrating portion B' in FIG. 11.

Figure 4:
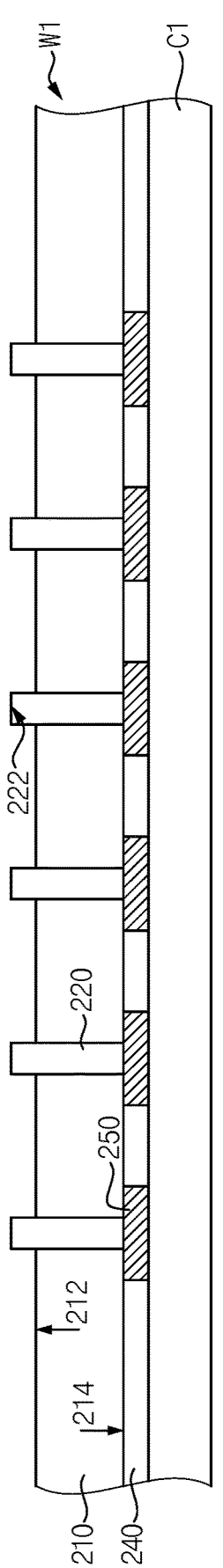

Referring to FIGS. 3 and 4, a first semiconductor wafer W1 on which a plurality of first semiconductor chips (dies) are formed may be provided on a substrate carrier C1.

In example embodiments, the first semiconductor wafer W1 may be a base wafer on which the plurality of first semiconductor chips 200 are formed. For example, the first semiconductor chips may include a memory chip or a logic chip to form the semiconductor package 10. The semiconductor package 10 may include a memory device. The memory device may include a high bandwidth memory (HBM) device.

As illustrated in FIG. 3, the first semiconductor wafer W1 may include a first substrate 210, a first through via 220 partially penetrating the first substrate 210, and a first bonding pad 250 provided on the first through via 220.

For example, the first substrate 210 may include a semiconductor material such as silicon, germanium, or silicon-germanium. The first substrate 210 may include III-V compound semiconductors such as gallium phosphide (GaP), gallium arsenide (GaAs), or gallium antimonide (GaSb). The first substrate 210 may include a Silicon-On-Insulator (SOI) substrate or a Germanium-On-Insulator (GOI) substrate.

The first substrate 210 may have a second surface 212 and a first surface 214 opposite to each other. A first activation layer may be provided on the first surface 214 of the first substrate 210. The first activation layer may be covered by a first lower insulating layer 240 that is provided on the first surface 214 of the first substrate 210. The first activation layer may include an insulating layer, and a plurality of redistribution wires provided in the insulating layer. The redistribution wires may be connected to the second end of the first through via 220 that is opposite to the first end 222 of the first through via 220. Circuit patterns may be formed in the first activation layer.

The first through via 220 may contact the first bonding pad 250 that is electrically connected to the redistribution wires. The first through via 220 may be electrically connected to the first bonding pad 250. The first bonding pad 250 may have a third diameter D3. The third diameter D3 of the first bonding pad 250 may be greater than a first diameter D1 of the first through via 220. For example, the first diameter D1 may be within a range of 2 μm to 6 μm. The third diameter D3 may be within a range of 6 μm to 10 μm.

As illustrated in FIG. 4, the second surface 212 of the first substrate 210 may be polished using a substrate support system (WSS). After the first semiconductor wafer W1 is attached on the substrate carrier C1 through an adhesive film, the second surface 212 of the first substrate 210 may be removed until a portion of the first through via 220 is exposed.

The second surface 212 of the first substrate 210 may be partially removed by a grinding process such as a chemical mechanical polishing (CMP) process. Accordingly, a thickness of the first substrate 210 may be reduced to a desired thickness. The first end 222 of the first through via 220 may be exposed from the second surface 212 of the first substrate 210. The first end 222 of the first through via 220 may protrude from the second surface 212 of the first substrate 210.

Figure 5:
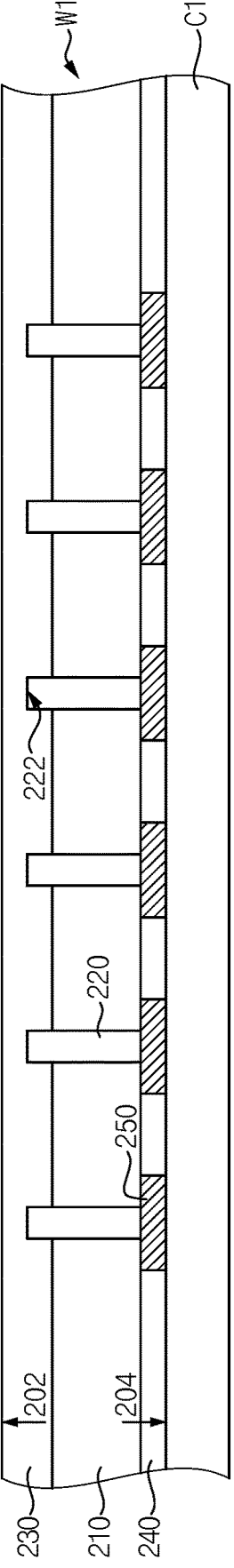
Figure 6:
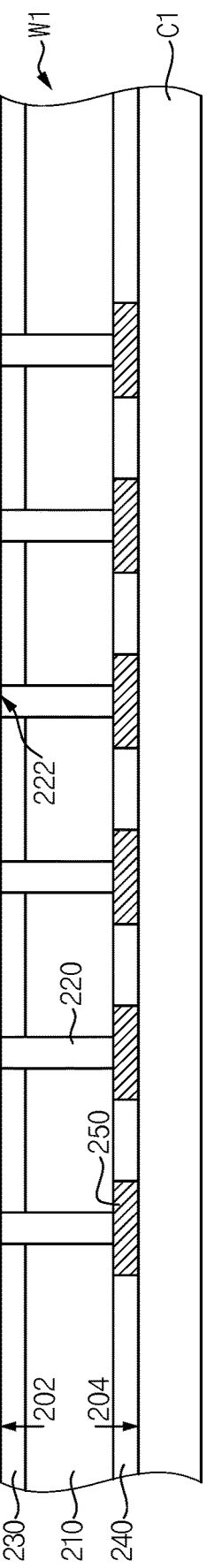

Referring to FIGS. 5 and 6, a first upper insulating layer 230 may be formed to cover the first through vias 220 that protrude from the second surface 212 of the first substrate 210. The first semiconductor wafer W1 on which the first upper insulating layer 230 is formed may have a first rear surface 202 and a first front surface 204 opposite to each other.

As illustrated in FIG. 6, the first upper insulating layer 230 may be polished. The first upper insulating layer 230 of the first substrate 210 may be removed until a portion of the first through via 220 is exposed. The first upper insulating layer 230 may be partially removed by the grinding process. The first end 222 of the first through via 220 may be exposed from the first upper insulating layer 230.

Figure 7:
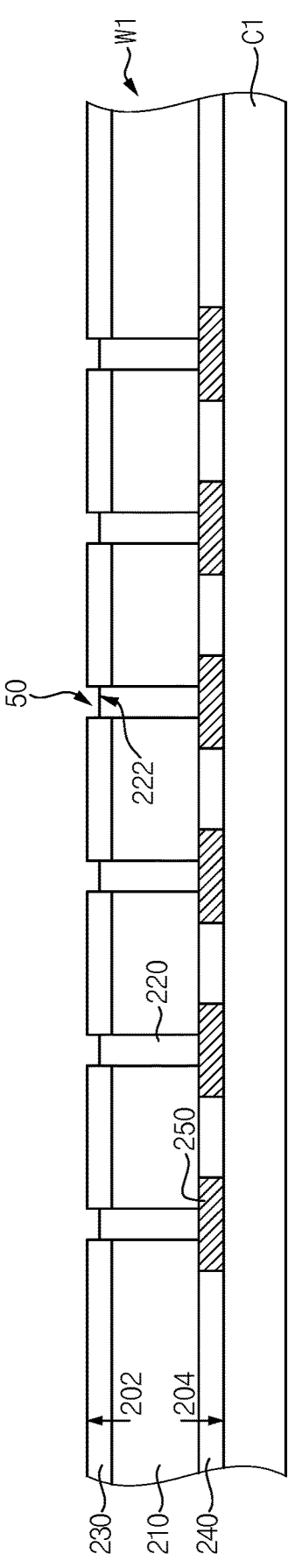

Referring to FIG. 7, the first end 222 of the first through via 220 that is exposed from the first upper insulating layer 230 may be partially removed.

The first end 222 of the first through via 220 may be partially removed by a wet etching process. The wet etching process may be performed through an etchant that has an etching selectivity with respect to the first through vias 220. For example, the etchant may include water ($H_2O$), hydrogen peroxide ($H_2O_2$), citric acid ($C_6H_8O_7$), and the like. Alternatively, the first through via 220 may be removed by a dry etching process, a plasma etching process, or the like.

The first through via 220 may be partially removed from the first rear surface 202 of the first semiconductor chip 200 by a first thickness T1. For example, the first thickness T1 may be within a range of 0.5 μm to 1.5 μm.

Referring to FIGS. 8 to 14, a first conductive pad 270 and a first dummy pad 260 may be formed in the first upper insulating layer 230.

Figure 8:
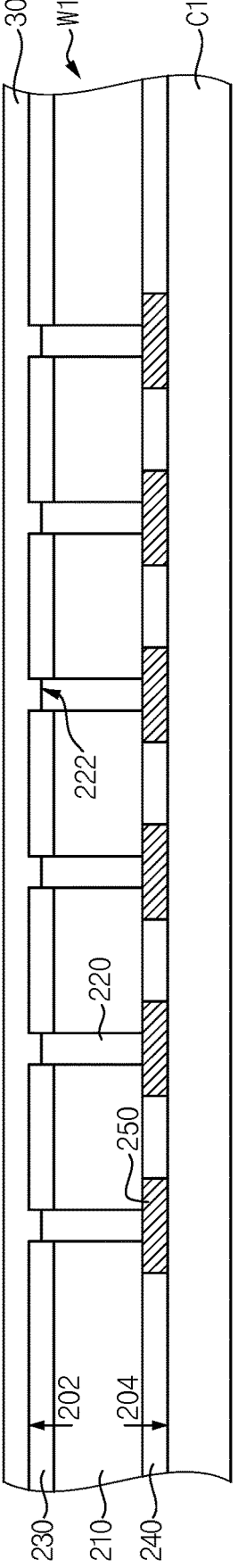

As illustrated in FIG. 8, a photoresist layer 30 may be formed on the first rear surface 202 of the first semiconductor wafer W1. The photoresist layer 30 may be formed to cover the first upper insulating layer 230 and the first end 222 of the first through via 220.

Figure 9:
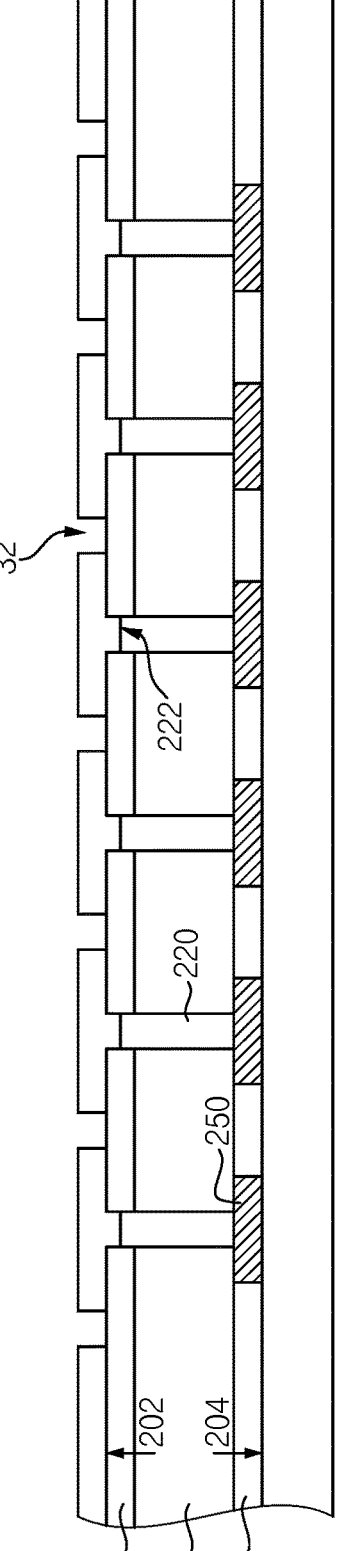

Then, as illustrated in FIG. 9, an exposure process may be performed on the photoresist layer 30 to form a photoresist pattern 32 having an opening that exposes a first dummy pad region.

Figure 10:
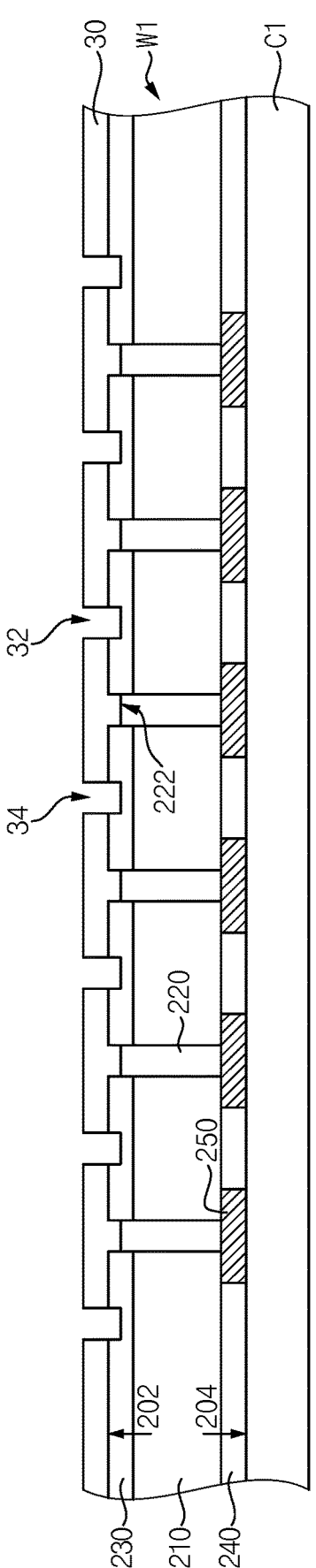
Figure 11:
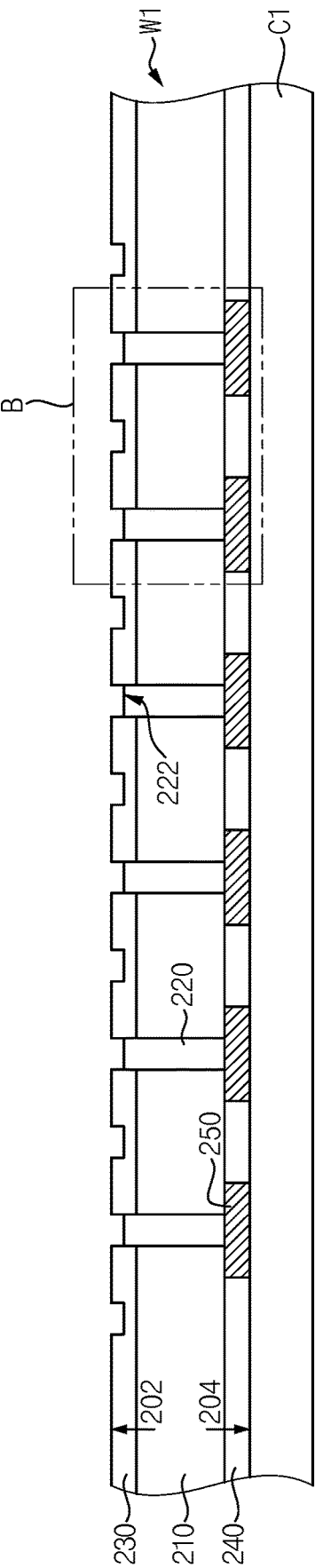

Then, as illustrated in FIG. 10, an etching process may be performed on the first upper insulating layer 230 using the photoresist pattern 32 an etching mask to form a cavity 34 for forming the first dummy pad 260. After the cavity 34 is formed, the photoresist pattern 32 may be removed. For example, the etching process may include a dry etching process, a plasma etching process, and the like.

The dry etching process may include a physical etching process, a chemical etching process, a physical chemical etching process, etc. The plasma etching process may be performed using inductively coupled plasma, capacitively coupled plasma, microwave plasma, or the like.

The cavity 34 may have a first depth H1 from the first rear surface 202 of the first semiconductor wafer W1. The first depth H1 of the cavity 34 may be equal to the first thickness T1 of the first through via 220 that is removed from the first rear surface 202 of the first semiconductor wafer W1. For example, the first depth H1 may be within a range of 0.5 μm to 1.5 μm.

As illustrated in FIG. 12A, the first upper insulating layer 230 may have an opening 50 having a bottom surface 52 that exposes the first end 222 of the first through via 220. The bottom surface 52 of the opening 50 may be provided on the same plane as an upper surface of the first through via 220 (i.e., first end 222). A diameter D2 of the opening 50 may be the same as the first diameter D1 of the first through via 220. A sidewall 54 of the opening 50 may be spaced apart from an outer surface of the first through via 220. The first upper insulating layer 230 may cover the first through vias 220 on the first rear surface 202 of the first semiconductor wafer W1.

As illustrated in FIG. 12B, the upper surface of the first through via 220 (i.e., first end 222) may be higher than the bottom surface 52 of the opening 50. The bottom surface 52 of the opening 50 may be lower than the upper surface of the first through via 220 (i.e., first end 222). The diameter D2 of the opening 50 may be greater than the first diameter D1 of the first through via 220.

As illustrated in FIG. 12C, the upper surface of the first through via 220 (i.e., first end 222) and the bottom surface 52 of the opening 50 may be provided on the same plane. The diameter D2 of the opening 50 may be smaller than the first diameter D1 of the first through via 220.

Figure 13:
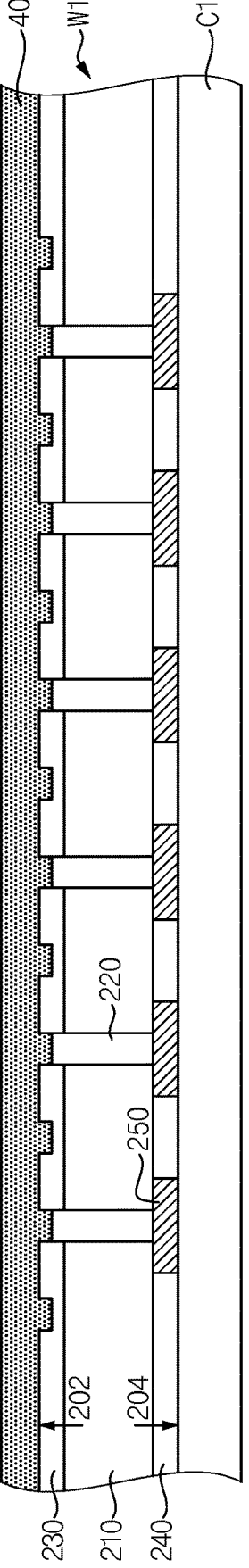
Figure 14:
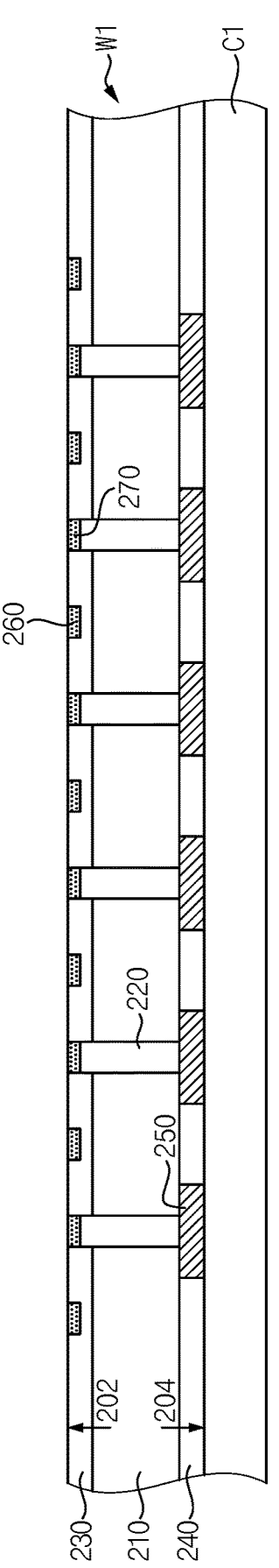

Then, as illustrated in FIGS. 13 and 14, a plating process may be performed on the first upper insulating layer 230 to form the first conductive pad 270 and the first dummy pads 260.

A conductive material 40 may be applied on the first upper insulating layer 230. The conductive material 40 may flow onto the first side 222 of the first through via 220 that is exposed from the first upper insulating layer 230, and may be hardened thereon. The conductive material 40 may flow into the cavity 34, and may be hardened therein.

One surface of the hardened conductive material 40 may be partially removed by a grinding process such as a chemical mechanical polishing (CMP) process. Accordingly, the first upper insulating layer 230 may be exposed from the first rear surface 202 of the first semiconductor wafer W1. Upper surfaces of the first dummy pad 260 and the first conductive pad 270 may be exposed from the second surface 212 of the first substrate 210.

Since the conductive material 40 is hardened on the first side 222 of the first through via 220 that is exposed from the first upper insulating layer 230, the second diameter D2 of the first conductive pad 270 may be equal to the first diameter D1 of the first through via 220. For example, the second diameter D2 may be within a range of 2 μm to 6 μm.

After the first through via 220 penetrating the first substrate 210 is formed, the first conductive pad 270 may be formed on the first end 222 of the first through via 220. In the process of forming the first through via 220, a decrease in expansion of the first through via 220 caused by thermal budget may be solved through the first conductive pad 270 that is formed on the first end 222 of the first through via 220.

Since the second diameter D2 of the first conductive pad 270 is the same as the first diameter D1 of the first through via 220, an area occupied by the upper surface of the first conductive pad 270 on the first upper insulating layer 230 may be limited to the first side 222 of the first through via 220. Since the area occupied by the first conductive pad 270 is small, the number of first dummy pads 260 that are formed in the first upper insulating layer 230 may increase. The first semiconductor chip 200 may dissipate more heat from an inside through the greater number of first dummy pads 260.

Since the second diameter D2 of the first conductive pad 270 is the same as the first diameter D1 of the first through via 220, a thickness of the first upper insulating layer 230 may be reduced. Therefore, the first semiconductor chip 200 may discharge more heat from the inside through the thinner first upper insulating layer 230.

Since the second diameter D2 of the first conductive pad 270 is the same as the first diameter D1 of the first through via 220, a dishing phenomenon that occurs in the first conductive pad 270 may be prevented.

For example, the first conductive pad 270 and the first dummy pad 260 may include copper (Cu), aluminum (Al), tungsten (W), nickel (Ni), molybdenum (Mo), gold (Au), Silver (Ag), chromium (Cr), tin (Sn), and titanium (Ti).

Figure 15:
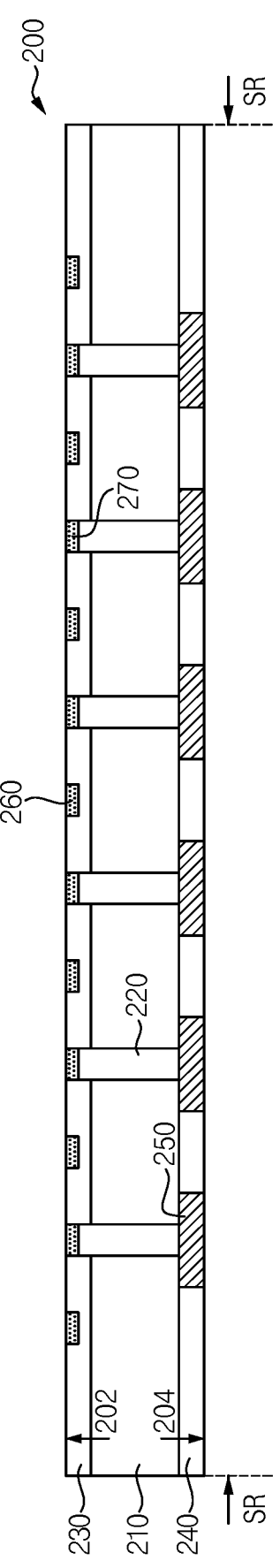
Figure 16:
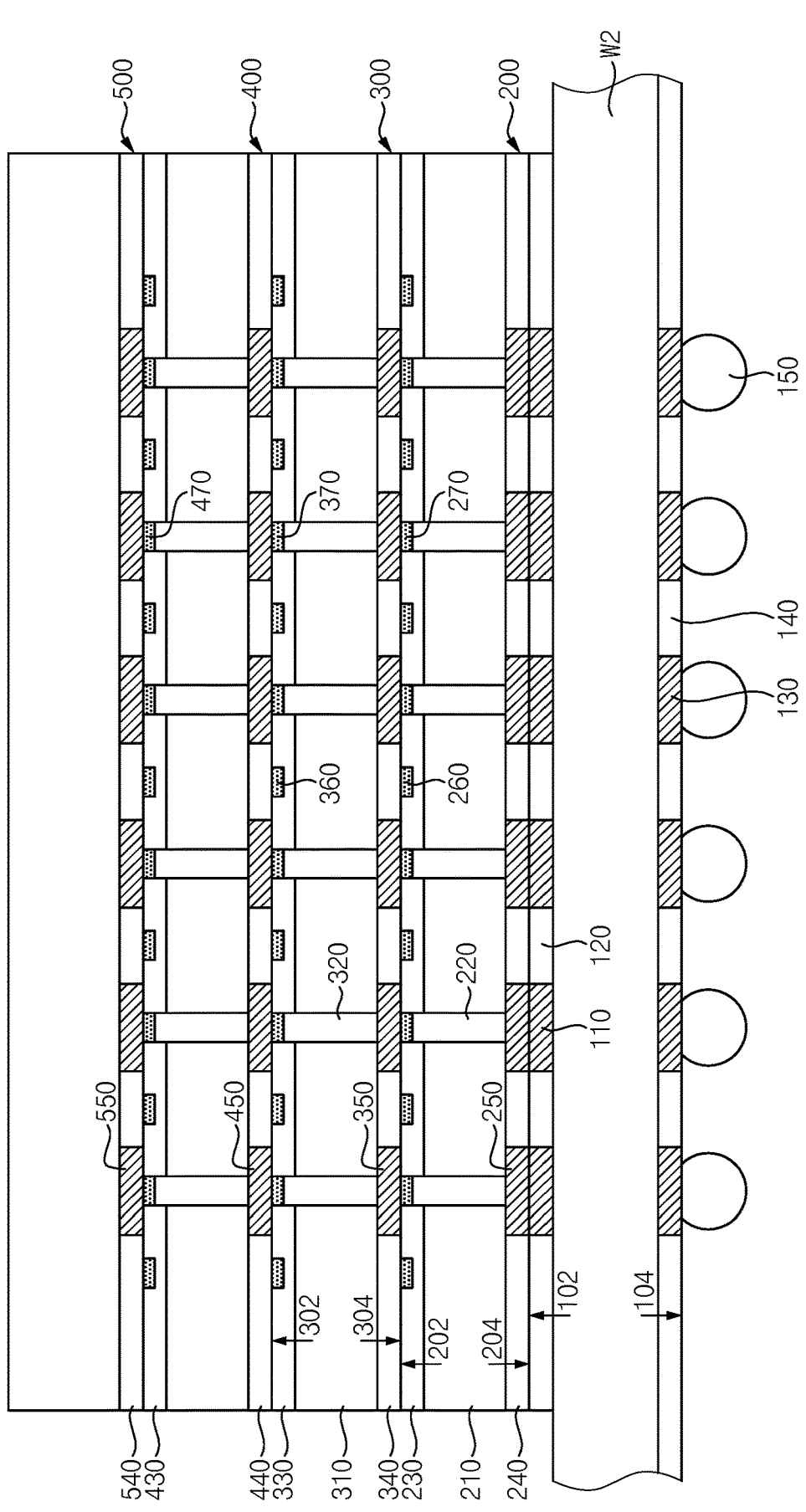

Referring to FIGS. 15 and 16, the first semiconductor wafer W1 may be cut to form a plurality of the first semiconductor chips 200. The first semiconductor chips 200 may be stacked on a second semiconductor wafer W2. The second to fourth semiconductor chips 300, 400, and 500 may be manufactured by the same process as the manufacturing process of the first semiconductor chip 200.

As illustrated in FIG. 15, the first semiconductor wafer W1 may be cut along a scribe lane region SR to form the plurality of first semiconductor chips 200. The first semiconductor wafer W1 may be cut by a sawing process. The scribe lane region SR may have a rectangular annular shape with a predetermined gap between the first semiconductor chips 200 and an outer surface of the first semiconductor chip 200.

As illustrated in FIG. 16, the first semiconductor chip 200 may be placed on the second semiconductor wafer W2 such that the first bonding pad 250 of the first semiconductor chip 200 faces the second semiconductor wafer W2.

The plurality of semiconductor chips 200, 300, 400, and 500 may be arranged on the second semiconductor wafer W2. The first to fourth semiconductor chips 200, 300, 400, and 500 may be stacked on the second semiconductor wafer W2. The first to fourth semiconductor chips 200, 300, 400, and 500 may be respectively fixed on first substrate pads 110 of the second semiconductor wafer W2 through a reflow process. The reflow process may refer to a technical process that applies a high-temperature heat source to stably bond the first to fourth semiconductor chips 200, 300, 400, and 500 onto the second semiconductor wafer W2.

A second lower insulating layer 340 of the second semiconductor chip 300 and the first upper insulating layer 230 of the first semiconductor chip 200 may be directly bonded to each other. A second bonding pad 350 of the second semiconductor chip 300 may be bonded to the first conductive pad 270 of the first semiconductor chip 200. Thus, the first conductive pad 270 and the second bonding pad 350 may be mutually connected by copper-copper hybrid bonding between the first semiconductor chip 200 and the second semiconductor chip 300. For example, pad to pad direct bonding of the first conductive pad 270 and the second bonding pad 350 may be formed.

In a process of bonding the first semiconductor chip 200 and the second semiconductor chip 300, adhesion problem of the second bonding pad 350 that occurs due to the decrease in the expansion of the first through via 220 may be solved through the first conductive pad 270. The first conductive pad 270 may enhance adhesion between the first through via 220 and the second bonding pad 350.

Figure 17:
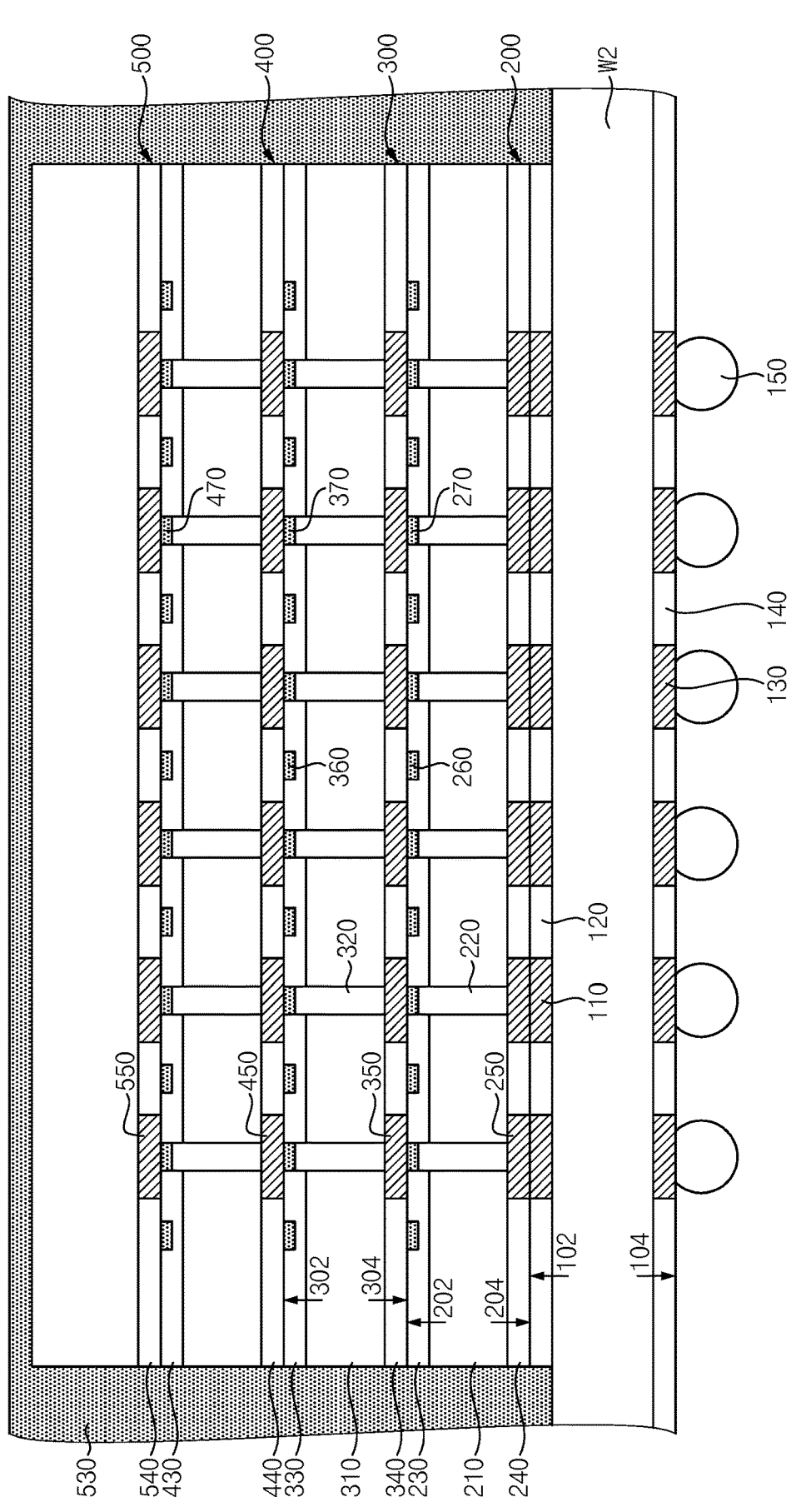

Referring to FIG. 17, a molding member 530 may be formed on the second semiconductor wafer W2 to cover the semiconductor chips 200, 300, 400, and 500. For example, the molding member 530 may include an epoxy molding compound (EMC) or the like.

Figure 18:
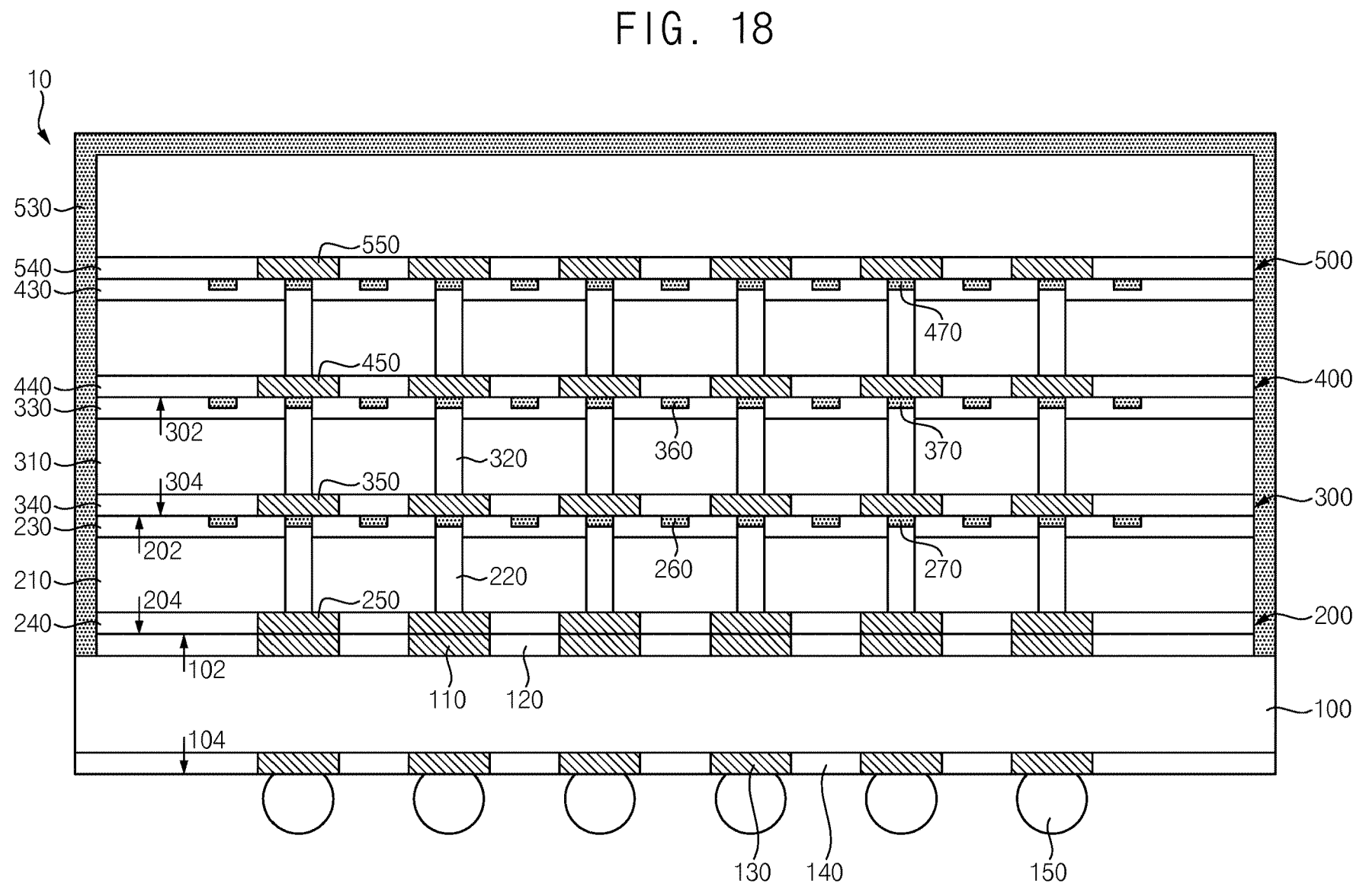

Referring to FIG. 18, the second semiconductor wafer W2 may be cut to complete the semiconductor package 10 in FIG. 1. The second semiconductor wafer W2 may be cut by a dicing process.

As described above, the first through via 220 of the first semiconductor chip 200 may be bonded to the second bonding pad 350 of the second semiconductor chip 300 through the first conductive pad 270. After the first through via 220 penetrating the first substrate 210 is formed, the first conductive pad 270 may be formed on the first end 222 of the first through via 220. In a process of forming the first through via 220, the expansion of the first through via 220 caused by a thermal budget may cause an adhesion problem with the second bonding pad 350 of the second semiconductor chip 300. The first conductive pad 270 formed on the first side 222 of the first through via 220 may solve the adhesion problem.

Further, since the first diameter D1 of the first through via 220 and the second diameter D2 of the conductive pad 270 are identical to each other, the dishing phenomenon that occurs in the first conductive pad 270 may be solved. Since the first through via 220 is etched to form the first conductive pad 270, the thickness of the first insulating layer 230 may decrease, and thermal resistance in the first semiconductor chip 200 may decrease. Since the first conductive pad 270 is formed simultaneously with the first dummy pad 260, the manufacturing process may be simplified and the manufacturing cost may be reduced.

The foregoing is illustrative of example embodiments and is not to be construed as limiting thereof. Although example embodiments have been described, those skilled in the art will readily appreciate that many modifications are possible in example embodiments without materially departing from the novel teachings and advantages of aspects of the present invention. Accordingly, all such modifications are intended to be included within the scope of example embodiments as defined in the claims.

What is claimed is:

1. A method of manufacturing a semiconductor package, the method comprising:

forming a first semiconductor chip including a first substrate, the first substrate having first and second surfaces opposite to each other;

forming a second semiconductor chip including a second substrate, the second substrate having third and fourth surfaces opposite to each other; and arranging the second semiconductor chip on the first semiconductor chip such that a front surface of the second semiconductor chip faces a rear surface of the first semiconductor chip, and bonding pads that are exposed from the front surface of the second semiconductor chip are bonded to conductive pads that are exposed from the rear surface of the first semiconductor chip, wherein the forming the first semiconductor chip includes, forming a first through via that penetrates the first substrate from an activation layer that is formed on the first surface of the first substrate, the first through via having a first diameter;

forming a first insulating layer that exposes a first end of the first through via on the second surface of the first substrate;

etching the first end of the first through via that is exposed from an outer surface of the first insulating layer to a first depth; and applying a conductive material on the first end of the first through via to form a first conductive pad that is included among the conductive pads, the first conductive pad having a second diameter.

2. The method of claim 1, wherein the forming the second semiconductor chip includes, forming a second through via that penetrates the second substrate from an activation layer formed on the third surface of the second substrate, the second through via having a third diameter;

forming a second insulating layer that exposes a first end of the second through via on the third surface of the second substrate;

etching the first end of the second through via that is exposed from an outer surface of the second insulating layer to a second depth; and applying the conductive material on the first end of the second through via to form a second conductive pad that has a fourth diameter.

3. The method of claim 2, wherein a bonding pad included among the bonding pads of the second semiconductor chip has a fifth diameter that is greater than the second diameter of the first conductive pad.

4. The method of claim 3, wherein the second diameter of the first conductive pad is within a range of 2 μm to 6 μm, and the fifth diameter of the bonding pad is within a range of 6 μm to 10 μm.

5. The method of claim 1, wherein the forming the first semiconductor chip further includes, forming a plurality of cavities on the outer surface of the first insulating layer; and filling up the plurality of cavities with the conductive material to form a plurality of dummy pads.

6. The method of claim 5, wherein the forming the plurality of cavities includes, forming the plurality of cavities from the outer surface of the first insulating layer to have a third depth that is equal to the first depth.

7. The method of claim 1, wherein the forming the first through via includes, forming the first through via such that the first end of the first through via protrudes from the second surface of the first substrate, and the forming the first insulating layer includes, forming the first insulating layer on the second surface of the first substrate to cover the first through via; and polishing the first insulating layer to expose the first end of the first through via.

8. The method of claim 1, wherein the etching the first end of the first through via includes etching through etchant that has an etching selectivity with respect to the first through via.

9. The method of claim 1, wherein the conductive material includes at least one of nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), and tin (Sn).

10. The method of claim 1, wherein the first end of the first through via is etched such that the first end of the first through via is below a top surface of the first insulating layer.

11. A semiconductor package, comprising:

a first semiconductor chip having a first front surface and a first rear surface opposite to each other; and a second semiconductor chip having a second front surface that is bonded to the first rear surface of the first semiconductor chip, the second semiconductor chip having bonding pads that are exposed from the second front surface, wherein the first semiconductor chip includes, a first substrate having a first surface, and a second surface opposite to the first surface;

a circuit layer provided on the first surface of the first substrate;

a first through via extending to penetrate through the first substrate, the first through via having a first diameter;

a first insulating layer partially covering the first through via on the second surface of the first substrate, the first insulating layer having a first opening that has a first depth from an outer surface of the first insulating layer, the first opening having a bottom surface that exposes a first end of the first through via; and a first conductive pad, having a second diameter, provided on the exposed first end of the first through via in the first opening of the first insulating layer, the first conductive pad bonded to a bonding pad included among the bonding pads of the second semiconductor chip.

12. The semiconductor package of claim 11, wherein the second semiconductor chip includes, a second substrate having a third surface, and a fourth surface opposite to the third surface;

a second circuit layer provided on the third surface of the second substrate;

a second through via extending to penetrate through the second substrate, the second through via having a third diameter;

a second insulating layer covering the second through via on the fourth surface of the second substrate;

the second insulating layer having a second opening that has a second depth from an outer surface of the second insulating layer, the second opening having a bottom surface that exposes a first end of the second through via; and a second conductive pad, having a fourth diameter, provided on the exposed first end of the second through via in the second opening of the second insulating layer.

13. The semiconductor package of claim 12, wherein the bonding pad of the second semiconductor chip has a fifth diameter that is greater than the second diameter of the first conductive pad.

14. The semiconductor package of claim 13, wherein the second diameter of the first conductive pad is equal to the first diameter of the first through via.

15. The semiconductor package of claim 13, wherein the second diameter of the first conductive pad is within a range of 2 μm to 6 μm, and the fifth diameter of the bonding pad is within a range of 6 μm to 10 μm.

16. The semiconductor package of claim 11, wherein the first semiconductor chip further includes a plurality of dummy pads that are provided within the first insulating layer, the plurality of dummy pads being exposed from the first rear surface.

17. The semiconductor package of claim 16, wherein the first conductive pad has a first thickness, and each of the plurality of dummy pads has a second thickness that is equal to the first thickness.

18. The semiconductor package of claim 11, wherein the first through via includes a first metal material, and the first conductive pad includes a second metal material that is different from the first metal material.

19. The semiconductor package of claim 11, wherein the first conductive pad is in contact with and directly bonded to a bonding pad included among the bonding pads of the second semiconductor chip.

20. A method of manufacturing a semiconductor package, comprising:

forming a first semiconductor chip including a first substrate, the first substrate having first and second surfaces opposite to each other;

forming a second semiconductor chip including a second substrate, the second substrate having third and fourth surfaces opposite to each other; and arranging the second semiconductor chip on the first semiconductor chip such that a front surface of the second semiconductor chip faces a rear surface of the first semiconductor chip, and bonding pads that are exposed from the front surface of the second semiconductor chip are bonded to conductive pads that are exposed from the rear surface of the first semiconductor chip, wherein the forming the first semiconductor chip includes, forming a first through via that penetrates the first substrate from an activation layer formed on the first surface of the first substrate, the first through via having a first diameter;

forming a first insulating layer that exposes a first end of the first through via on the second surface of the first substrate;

etching the first end of the first through via that is exposed from an outer surface of the first insulating layer to a first depth;

forming a plurality of first cavities in the outer surface of the first insulating layer; and applying a conductive material on the first end of the first through via to form a first conductive pad that is included among the conductive pads, the first conductive pad having a second diameter equal to the first diameter and on the plurality of first cavities to form a plurality of dummy pads, wherein the forming the second semiconductor chip includes, forming a second through via that penetrates the second substrate from the bonding pads formed on the third surface of the second substrate, the second through via having a third diameter;

forming a second insulating layer that exposes a first end of the second through via on the fourth surface of the second substrate;

etching the first end of the second through via that is exposed from an outer surface of the second insulating layer to a second depth;

forming a plurality of second cavities on the outer surface of the second insulating layer; and applying the conductive material on the first end of the second through via to form a second conductive pad that has a fourth diameter equal to the third diameter and on the second cavities to form a plurality of second dummy pads.

\*　\*　\*　\*　\*